(12) United States Patent
Hazama

(10) Patent No.: US 7,786,524 B2
(45) Date of Patent: Aug. 31, 2010

(54) SEMICONDUCTOR DEVICE AND METHOD OF MANUFACTURING THE SAME

(75) Inventor: Hiroaki Hazama, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 215 days.

(21) Appl. No.: 11/889,279

(22) Filed: Aug. 10, 2007

(65) Prior Publication Data

US 2008/0073696 A1 Mar. 27, 2008

(30) Foreign Application Priority Data

Aug. 11, 2006 (JP) ............................. 2006-219305

(51) Int. Cl.
*H01L 29/788* (2006.01)
*H01L 21/336* (2006.01)

(52) U.S. Cl. .................. 257/316; 438/261; 257/E21.01

(58) Field of Classification Search ......... 257/314–318, 257/E21.453, 239, E29.129, 324–326; 438/183, 438/926, 43, 257, 593
See application file for complete search history.

(56) References Cited

U.S. PATENT DOCUMENTS

| | | | |
|---|---|---|---|
| 5,641,696 A * | 6/1997 | Takeuchi ..................... 438/257 |
| 6,472,707 B1 * | 10/2002 | Takahashi ..................... 257/316 |
| 6,521,941 B2 | 2/2003 | Park et al. |
| 6,661,052 B2 | 12/2003 | Matsui et al. |
| 6,784,503 B2 | 8/2004 | Shimizu et al. |
| 6,897,524 B2 | 5/2005 | Kamiya |
| 6,969,660 B2 * | 11/2005 | Goda et al. .................. 438/286 |
| 7,079,437 B2 | 7/2006 | Hazama et al. |
| 7,244,984 B2 * | 7/2007 | Kamigaichi et al. .......... 257/316 |
| 2005/0180213 A1 | 8/2005 | Abe et al. |
| 2005/0266640 A1 * | 12/2005 | You et al. .................... 438/257 |
| 2006/0278919 A1 * | 12/2006 | Takahashi .................... 257/316 |

* cited by examiner

*Primary Examiner*—Steven Loke
*Assistant Examiner*—Jonathan Han
(74) *Attorney, Agent, or Firm*—Finnegan, Henderson, Farabow, Garrett & Dunner, L.L.P.

(57) ABSTRACT

A semiconductor device includes a semiconductor substrate including a first region and a second region being adjacent to the first region; a floating gate electrode layer formed above the semiconductor substrate in the first region, the floating gate electrode layer including a first width; a dummy gate electrode layer formed above the semiconductor substrate in the second region, the dummy gate electrode layer including a second width being greater than the first width of the floating gate electrode layer; a first gate insulating film formed on the floating gate electrode layer, the first gate insulating film including a first thickness; a second gate insulating film formed on the dummy gate electrode layer, the second gate insulating film including a second thickness being greater than the first thickness of the first gate insulating film; and a control gate electrode layer formed on the first and the second gate insulating films.

16 Claims, 18 Drawing Sheets

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Application No. 2006-219305, filed on, Aug. 11, 2006 the entire contents of which are incorporated herein by reference.

FIELD

The present disclosure is directed to a semiconductor device provided with a region configured at consistent widths in its semiconductor layer. The present disclosure is also directed to a method of manufacturing such semiconductor device.

BACKGROUND

One example of a semiconductor device provided with a semiconductor layer having a region configured at consistent widths is a nonvolatile semiconductor storage device such as a flash memory. The nonvolatile semiconductor device is configured by compartments of regions constituted by a memory cell region configured by a plurality of memory cells each provided with a floating gate electrode; and a peripheral circuit region configured by peripheral circuits that drive the memory cells of the memory cell region.

The memory cell region of the nonvolatile semiconductor storage device includes a region where the memory cells are actually formed (hereinafter referred to as the cell array forming region). In the cell array forming region, the active area and the floating gate electrode layer are disposed at predetermined consistent widths in a predetermined direction parallel to the surface of the semiconductor substrate. Hence, multiple memory cells having desired characteristics are formed in the memory cell region to achieve integration and shrinking of the memory cells.

On the other hand, provided at the end of the of the memory cell region is a guard ring region (cell array end region) having increased width which is provided in the element isolation region. The cell array forming region, being electrically connected to a power supply terminal, and the like, is provided with a well contact region for establishing electrical connection with a well provided in the semiconductor substrate. The guard ring region and the well contact region need to be designed to have greater widths compared to the widths of the active area and the floating gate electrode layer of the cell array forming region in order to respectively retain their desired electrical characteristics. U.S. Pat. No. 6,521,941 discloses a nonvolatile semiconductor storage device provided with a dummy gate electrode structure on the gate electrode in the peripheral circuit region.

In the description given hereinafter, the active area and the floating gate electrode layer forming region of the cell array forming region are identified as a first region (cell array forming region) and the region (guard ring region and well contact region, and the like) having greater width compared to the first region is identified as a second region. In order to secure insulation from other regions or to obtain contact area, consistent width cannot be obtained at the boundary between the first region and the second region and in the proximity of the boundary, as far as design is concerned.

The lack of consistency in width results in reduction in exposure resolution of photolithography process executed during the device manufacturing process. Thus, the floating gate electrode layer in the proximity of the boundary region cannot be configured in a form having the desired characteristics. Therefore it is necessary to maintain consistency in the width dimension with minimum variation in the proximity of the boundary region.

Under such circumstances, there are some cases where substantially the same structure applied for the cell array forming region is employed for the structure formed over the surface of the semiconductor substrate of the second region as well. In other words, a dummy gate electrode layer corresponding to the floating gate electrode layer of the first region is provided in the second region. However, under such configuration, high electrical field applied to the floating gate electrode layer of the first region for write and erase operation results in application of high electrical field to the dummy gate electrode layer of the second region.

Consequently, insulation capacity of the insulation film becomes more prone to deteriorate by application of high electrical field in the second region because of its lower coupling ratio compared to the first region. Deterioration in insulation capacity of the insulating film leads to defects in electrical components of the device. Especially in the light of recent demand for thinner inter-gate insulating films, employing the inter-gate insulating film of the first region as it is to serve as an insulating film for covering the dummy gate electrode provides risk factors leading to destruction of the insulating film and the degradation in insulating capacity.

SUMMARY

An object of the present disclosure is to provide a semiconductor device including a first region having formed thereto an active area of a cell array forming region or a floating gate electrode layer forming region and a second region having formed thereto a region having greater width compared to the first region, in which the second region has improved breakdown voltage. It is another object of the present disclosure to provide a method of manufacturing such semiconductor device.

In one aspect of the present disclosure, a semiconductor device includes a semiconductor substrate including a first region and a second region being adjacent to the first region; a floating gate electrode layer formed above the semiconductor substrate in the first region, the floating gate electrode layer including a first width; a dummy gate electrode layer formed above the semiconductor substrate in the second region, the dummy gate electrode layer including a second width being greater than the first width of the floating gate electrode layer; a first gate insulating film formed on the floating gate electrode layer, the first gate insulating film including a first thickness; a second gate insulating film formed on the dummy gate electrode layer, the second gate insulating film including a second thickness being greater than the first thickness of the first gate insulating film; and a control gate electrode layer formed on the first and the second gate insulating films.

In another aspect of the present disclosure, a semiconductor device includes a semiconductor substrate including an upper surface having a first region and a second region being adjacent to the first region, the first region including a plurality of first active area formed along a first direction, the second region including a plurality of second active area formed along the first direction, each of the first active area including a first width, the second active area including a second width being greater than the first width of the first active area; a plurality of floating gate electrodes formed above each of the first active area along a second direction crossing the first direction; a plurality of dummy gate electrodes formed above each of the second active area along the second direction; a first gate insulating film formed on each of the floating gate electrodes, including a first thickness; a second gate insulating film formed on at least one of the dummy gate electrodes, including a second thickness being greater than the first thickness of the first gate insulating film; and a control gate electrode formed on the first and the second gate insulating films.

Yet, in another aspect of the present disclosure, a method of manufacturing a semiconductor device includes forming a first insulating film on a semiconductor substrate; forming a first conductive layer on the first insulating film; forming a plurality of mask patterns in a predetermined direction within a surface of the semiconductor substrate consistently at a predetermined first width while forming a first mask pattern in the predetermined direction in a second region of the semiconductor substrate adjacent the first region at a predetermined second width greater than the first width; forming a trench by etching the first conductive layer, the first insulating film, and the semiconductor substrate by using the first mask pattern as a mask; filling a second insulating film in the trench formed by the trench forming step; forming a third insulating film so as to cover the first conductive layer and the second insulating film of the first region and the second region respectively; forming a second mask pattern on the third insulating film at least in a portion of the second region; removing the third insulating film of the first region by using the second mask pattern as a mask; forming a fourth insulating film so as to cover the first conductive layer of the first region exposed by the removing step and the third insulating film of the second region; and forming a second conductive region on the fourth insulating film.

BRIEF DESCRIPTION OF THE DRAWINGS

Other objects, features and advantages of the present disclosure will become clear upon reviewing the following description of the embodiment of the present disclosure with reference to the accompanying drawings, in which.

DETAILED DESCRIPTION

A first embodiment employing a semiconductor device of the present disclosure to a NAND flash memory will be described with reference to FIGS. 1 to 16.

Figure 1:
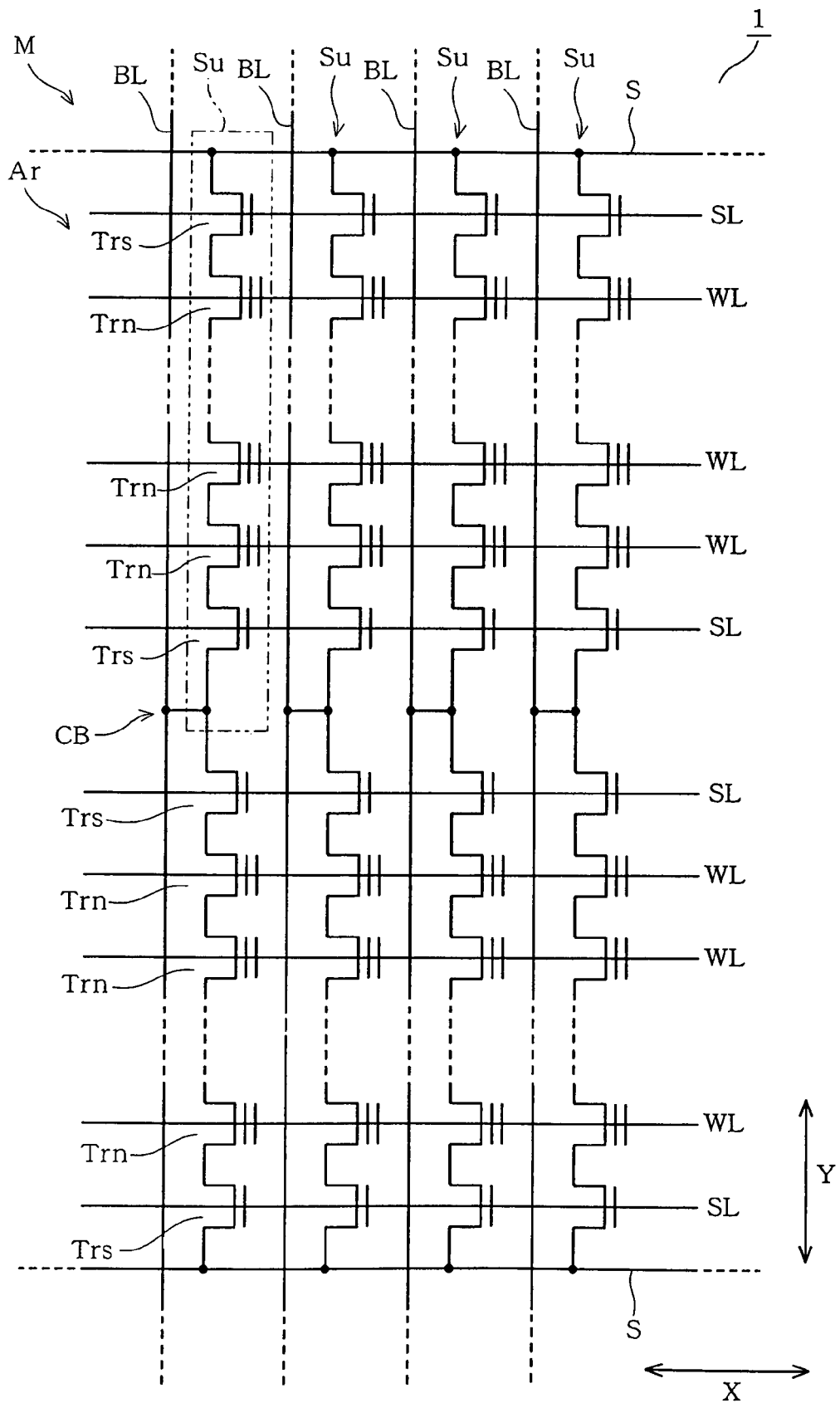
FIG. 1 illustrates an electrical configuration of a memory cell region indicating a first embodiment of the present disclosure.
Figure 2:
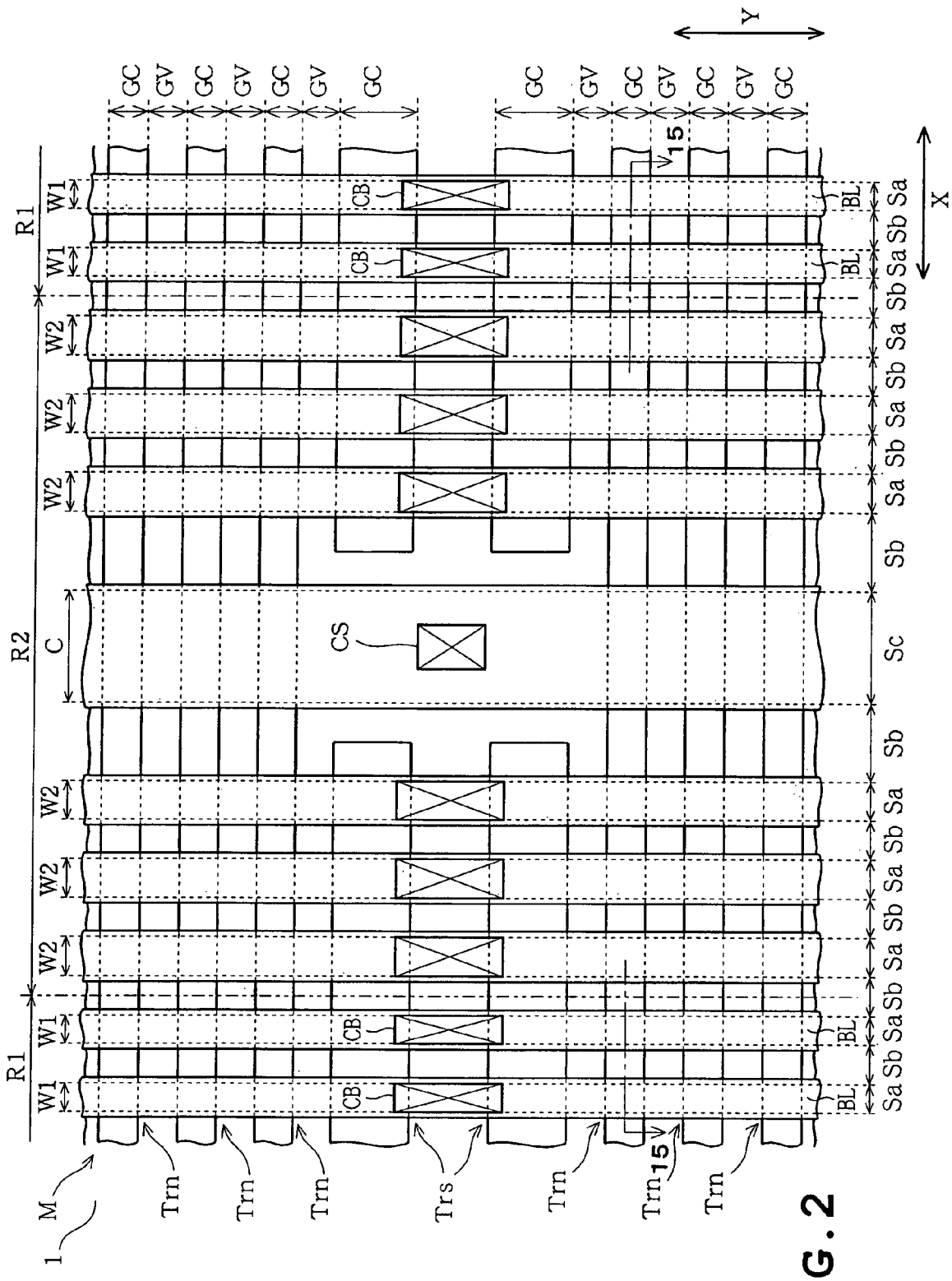
FIG. 2 is a schematic plan view illustrating the memory cell region and a source line contact region and a boundary region therebetween.

FIG. 1 schematically illustrates an equivalent circuit of a memory cell array in a NAND flash memory and FIG. 2 schematically illustrates a planar structure of a well contact forming region and its periphery.

As illustrated in FIG. 1, a NAND flash memory 1 is provided with a memory cell array Ar. The memory cell array Ar is configured by a matrix of NAND cell units SU. The NAND cell unit SU is constituted by two select gate transistors Trs, and a plurality (eight for example: nth power of 2 (n is a positive integer)) of memory cell transistors Trn connected in series to the two select gate transistors Trs. The plurality of neighboring memory cell transistors Trn shares source/drain regions within a single NAND cell unit SU.

Referring to FIG. 1, the memory cell transistors Trn aligned in an X-direction (corresponding to word line direction) are connected to a common word line (control gate line) WL. Also, the select gate transistors Trs aligned in the X-direction in FIG. 1 are connected to a common select gate line SL. The select gate transistors Trs are connected to a bit line BL extending in the Y-direction (corresponding to bit-line direction) perpendicularly intersecting the X-direction indicated in FIGS. 1 and 2 via the bit line contact CB.

A plurality of NAND cell units SU are separated from one another by an element isolation region Sb taking an STI (Shallow Trench Isolation) structure and extending in the Y-direction as viewed in FIG. 2.

The memory cell transistors Trn are formed at intersections of an active area (element forming region) Sa extending in a Y-axis direction and a word line WL extending in an X-axis direction formed at predetermined intervals.

The gate electrode structure in the memory cell region M constituting the features of the present embodiment will be described with reference to FIGS. 2 to 15. The features of the present embodiment lies in the structural difference between a plurality of first regions R1 (cell array forming region) where NAND cell units SU are substantially configured and a second region R2 (source line contact region and well contact region) constituting the boundary region between the plurality of first regions R1. Thus, focus will be placed on explaining such difference.

Referring to FIG. 2, the NAND cell units SU are configured in the first region R1. The second region R2 is situated adjacent the first region R1. The second region R2 constitutes the boundary region situated at the boundary between the plurality of the first regions R1. A source line contact region CS extending in the Y-direction is provided in the central portion of the second region R2. A contact formed in the source line contact region CS establishes electrical connection with a source line S. Three dummy gate regions extending in the Y-direction are formed respectively at both X-directional sides of the source line contact region CS of the second region R2.

Figure 15:
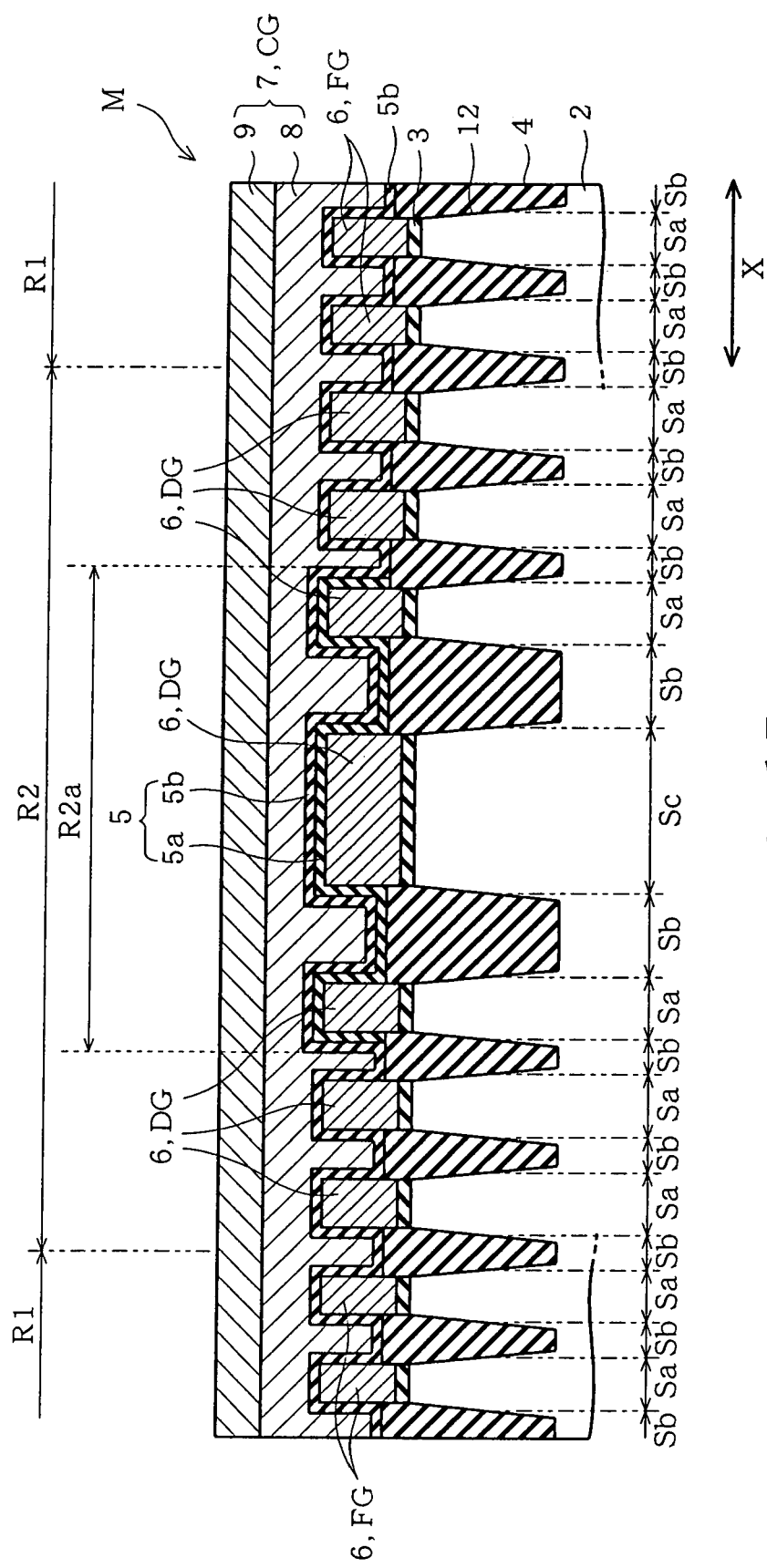

FIG. 15 schematically illustrates a vertical cross-sectional view taken along line 15-15 of FIG. 2. A flash memory 1 is configured by compartments of a memory cell region M and a peripheral circuit region (not shown) defined in a p-type silicon substrate 2 serving as a semiconductor substrate. Referring to FIG. 15, a insulating film 3 serving as a gate insulating film (gate oxide film, in other words, tunnel insulating film) is formed on a plurality of first active areas Sa of the silicon substrate 2. The insulating film 3 is also formed on a plurality of second active area Sc of the silicon substrate 2 to serve as a second gate insulating film.

The insulating film 3 is formed directly on the silicon substrate 2 so as to cover the upper side of the silicon substrate 2. A plurality of mutually isolated first conductive layers 6 are formed on the plurality of the insulating films 3. The first conductive layer 6 is formed as a dummy gate electrode layer DG in the second region R2.

The dummy gate electrode layer DG is provided for securing consistency in the structure between the first region R1 and the second region R2 and in the proximity of the boundary region therebetween to the possible extent in order to prevent reduction in exposure resolution during photolithography process. The first conductive layer 6 is configured by polycrystalline silicon doped with impurities such as phosphorous or arsenic.

The element isolation region Sb structurally isolates the plurality of the first conductive layers 6 (floating gate electrode layers FG and the dummy gate electrode layers DG) by predetermined width and predetermined intervals in the X-direction as viewed in FIG. 15, as well as providing electrical isolation.

An element isolation trench 12 is defined in the silicon substrate 2 of the element isolation region Sb, and an element isolation insulating film 4 serving as a second insulating film is filled in the element isolation trench 12. The element isolation insulating film 4 is constituted by a laminated structure constituted by a silicon oxide film and a coat-type insulating film (spin on glass film); where a silicon oxide film composed of TEOS (Tetra Ethoxy Silane) is formed along the lower side surface of the element isolation trench 12, and a coat-type insulating film is formed on the inner side of the silicon oxide film. The coat-type insulating film is formed at the upper side of the element isolation trench 12 and is composed of polysilazane solution which is a silica-based film forming chemical, for example. The lower side of the coat-type insulating film is formed so as to be covered by the silicon oxide film composed of TEOS. In the present embodiment, the element isolation insulating film 4 employs a two-layer structure constituted by the silicon oxide film composed of TEOS and the coat-type insulating film having outstanding gap-fill capability in view of reduction in the width of the element isolation insulating region Sb caused by shrinking of circuit design rule.

The upper surface of the element isolation insulating film 4 is formed so as to be higher than the upper surface of the insulating film 3 formed at both sides of the element isolation insulating film 4 and lower than the upper surface of the first conductive layer 6. Also, the element isolation insulating film 4 is formed so as to upwardly protrude from the surface of the silicon substrate 2. The upper side-surface of the element isolation insulating film 4 contacts the lower side-surface of the adjacent first conductive layer 6, whereby the two neighboring first conductive layers 6 are structurally and electrically isolated from the other.

The first conductive layer 6 of the first region R1 is configured by a predetermined X-directional width W1 (corresponding to a first width: 70 nm, for example) and at predetermined intervals, for example. The active area Sa of the first region R1 is also configured by the predetermined X-directional width W1 and at predetermined intervals. The first conductive layer 6 of the second region R2 is configured by an X-directional width W2 (corresponding to the second width: 100 nm, for example) greater than the width W1 and at predetermined intervals for example.

An inter-conductive layer insulating film 5 is formed along the upper surface and the upper side-surface of the first conductive layer 6 and the upper surface of the element isolation insulating film 4 so as to cover the foregoing. In the first region R1, the inter-conductive layer insulating film 5 is formed so as to provide structural and electrical isolation between the neighboring floating gate electrode layers FG and between the floating gate electrode layer FG and the control gate electrode CG. The inter-conductive layer insulating film 5 functions as an inter-gate insulating film.

The inter-conductive layer insulating film 5 is constituted by laminating nitride films and oxide films such as an HTO (High Temperature Oxide) film, an ONO film (silicon oxide film (oxide film layer)-silicon nitride film (nitride film layer)-silicon oxide film (oxide film layer)), and NONON film (silicon nitride film (nitride film layer)-silicon oxide film (oxide film layer)-silicon nitride film (nitride film layer)-silicon oxide film (oxide film layer)-silicon nitride film (nitride film layer)). Alternatively, the inter-conductive layer insulating film 5 may be constituted by a laminated structure composed of a plurality of layers such as alumina and other films composed of materials having insulating capabilities.

In dummy gate electrode regions (refer to FIG. 15) situated respectively at both adjacent sides of the source line contact region CS constituting a region Ra which is a part of the second region R2, the thickness of the inter-conductive layer insulating film 5 formed in the source line contact region CS and the thickness of the inter-conductive layer insulating film 5 formed in the dummy gate electrode region (refer to FIG. 15) at both adjacent sides of the source line contact region CS is configured at greater thickness as compared to the thickness of the corresponding film formed in the first region R1. The inter-conductive layer insulating film 5 may be configured so that its thickness throughout the entire region of the second region R2 is greater than the thickness of the inter-conductive layer insulating film 5 in the first region R1.

In the region R2a, the inter-conductive layer insulating film 5 is configured by a lower insulating film 5a composed of an HTO film, for example, and an upper insulating film (a fourth insulating film) 5b composed of an ONO film, for example, formed over the lower insulating film 5a.

In regions other than the region R2a, the inter-conductive layer insulating film 5 is formed by the upper insulating film 5b only. The upper insulating film 5b is configured at a predetermined thickness of 18 nm, for example (5 nm of silicon oxide film, 8 nm of silicon nitride film, and 5 nm of silicon oxide film) across the entire region of regions R1 and R2.

In the region R2a, the lower insulating film 5a interposes the upper insulating film 5b and the first conductive layer 6 and is configured at a thickness of 10 nm, for example. The lower insulating film 5a is an insulating film formed to improve voltage resistivity.

A second conductive layer 7 is formed so as to cover the top of the inter-conductive layer insulating film 5. The second conductive layer 7 is constituted by a lower conductive layer 8 configured by polycrystalline silicon doped with impurities such as phosphorous or arsenic, and an upper conductive layer 9 formed on the lower conductive layer 8. The upper conductive layer 9 is formed tungsten silicide or cobalt silicide, for example, and functions as a metal silicide layer for reducing resistance.

The second conductive layer 7 functions as a control gate electrode layer CG and a second gate electrode, and is formed over across the plurality of active areas Sa and element isolation regions Sb. Though not shown in FIG. 15, a silicon nitride film serving as a gate cap film, an interlayer insulating film and a bit line BL structure are formed over the control gate electrode layer CG to constitute a flash memory 1.

One indicator for evaluating the characteristics of the memory cell constituting the flash memory is the coupling ratio.

The coupling ratio Cr is described as:

$$Cr=Cono/(Cono+Cox) \quad (1)$$

It is desirable for the coupling ratio Cr of the above equation (1) to take a large value. Cono indicates the capacitance between the floating gate electrode layer FG and the control gate electrode layer CG confronting each other over inter-conductive insulating film 5. Cox indicates the capacitance of the capacitor between the silicon substrate 2 and the first conductive layer 6 confronting each other over the insulating film 3.

The value of the coupling ratio Cr is proportionate to the confronting area between the first and the second floating gate electrode layers 6 and 7, in which the coupling ratio Cr increases when the confronting area increases and decreases when the confronting area decreases under the condition where the thickness of the inter-conductive layer insulating film 5 is constant and the thickness of the first conductive layer 6 is constant.

The dummy gate electrode layer DG formed in the region R2a has its X-directional width configured at greater width compared to the X-directional width of the floating gate electrode layer FG formed in the first region R1. Thus, the coupling ratio Cr in the region R2a of the second region R2 is smaller compared to the coupling ratio Cr of the first region R1. When coupling ratio Cr is small, application of high electrical field provides risk factors leading to defects in electrical components due to degradation in insulation capacity by high field electric stress.

In the present embodiment, in the region R2a especially where the dummy gate electrode layer DG has increased width, the thickness of the inter-conductive layer insulating film 5 is configured to have greater thickness as compared to the region R1 by providing a lower insulating film 5a. Thus, voltage resistivity can be improved increasingly.

According to the structure of the present embodiment, the inter-conductive layer insulating film 5 at the dummy gate region adjacent to both X-directional sides of the source line contact region CS constituting at least the region R2a of the second region R2 is configured to have greater thickness than the inter-conductive layer insulating film 5 in the first region R1. Thus, even if high electrical field is applied simultaneously to both the first region R1 and the second region R2 when high electric field is applied to the floating gate electrode layer FG of the first region R1 at the time of writing/erasing the floating gate electrode layer FG, insulation breakdown or degradation in insulation capability of the inter-conductive layer insulating film 5 can be prevented. Moreover, even if the inter-conductive layer insulating film 5 in the first region R1 is made thinner by recent trend of reduction in film thickness, the inter-conductive layer insulating film 5 in the second region R2 can be made thick for increased improvement in voltage resistivity of the second region R2.

The inter-conductive layer insulating film 5 of the second region R2 is configured by laminating the upper insulating film 5b formed in the first region R1 over the lower insulating film 5a, thereby providing a simplified structure. Moreover, the insulating film need not be formed in separate steps for the first region R1 and the second region R2 during the manufacturing process, thereby simplifying the manufacturing process.

Employing laminated structure such as an ONO film composed of oxide film layer and nitride film layer for the inter-conductive layer insulating film 5 of the second region R2 provides high quality film yielding increased capability as an inter-gate insulating film between the floating gate electrode layer FG and the control gate electrode layer CG.

The manufacturing method of the above described structure will be described with reference to FIGS. 3 to 16. The description will focus on the features of the present embodiment. The later described steps may be omitted as required and generally accepted steps may be added as long as the present invention can be realized.

Figure 3:
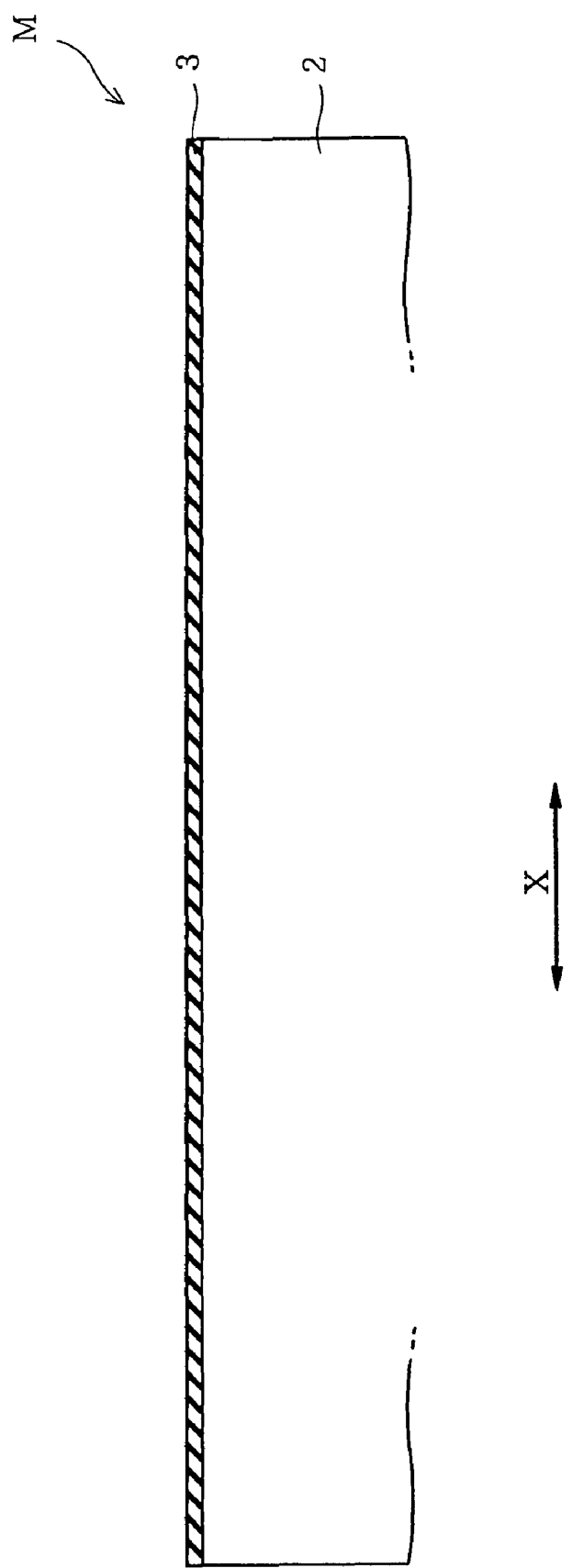
FIGS. 3 to 15 schematically illustrate vertical cross sections of one manufacturing step (part 1 to 13)
Figure 4:
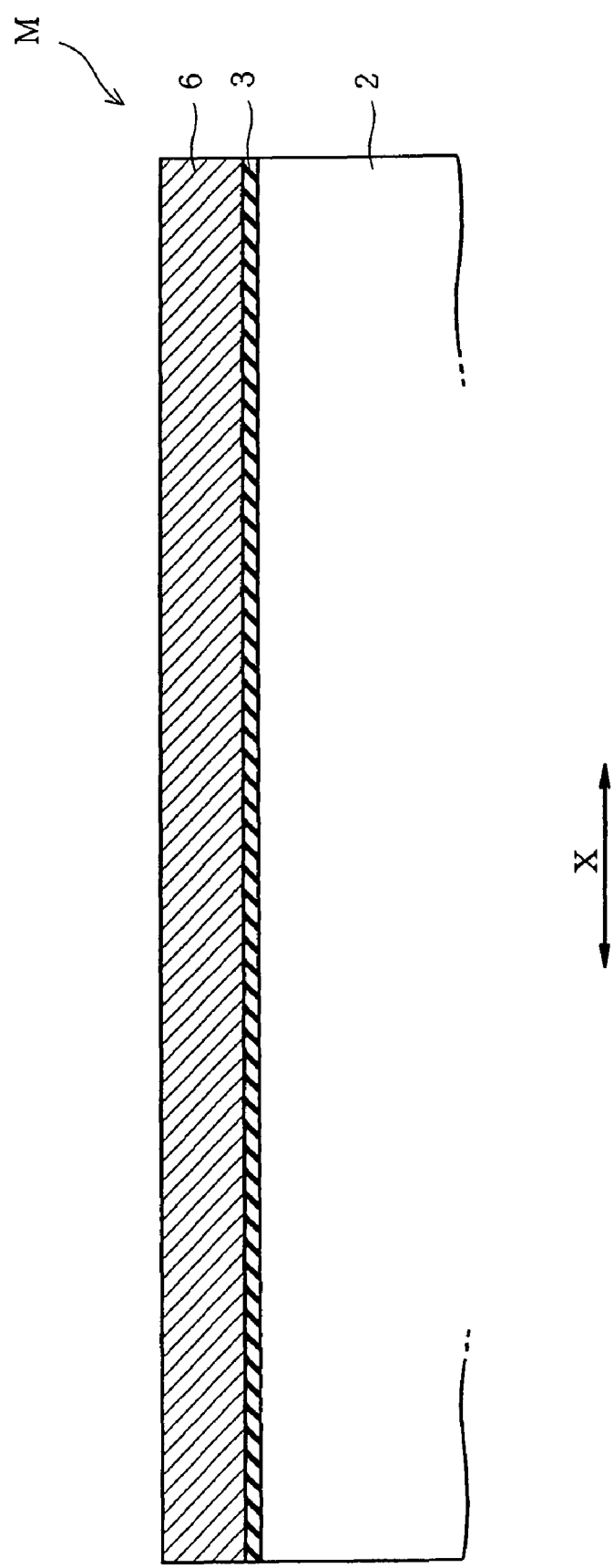

Referring to FIG. 3, the insulating film 3 is formed directly on the silicon substrate 2 by silicon oxide film in a predetermined thickness of 10 [nm] by thermal oxidation. Next, referring to FIG. 4, a first conductive layer 6 in a predetermined thickness of 140 [nm] is formed directly over the insulating film 3 by LPCVD (Low Pressure-Chemical Vapor Deposition) by depositing amorphous silicon doped with impurities such as phosphorous or arsenic, for example, so as to cover the insulating film 3. The amorphous silicon is polycrystallized by the later described thermal processing and is converted into polycrystalline silicon.

Figure 5:
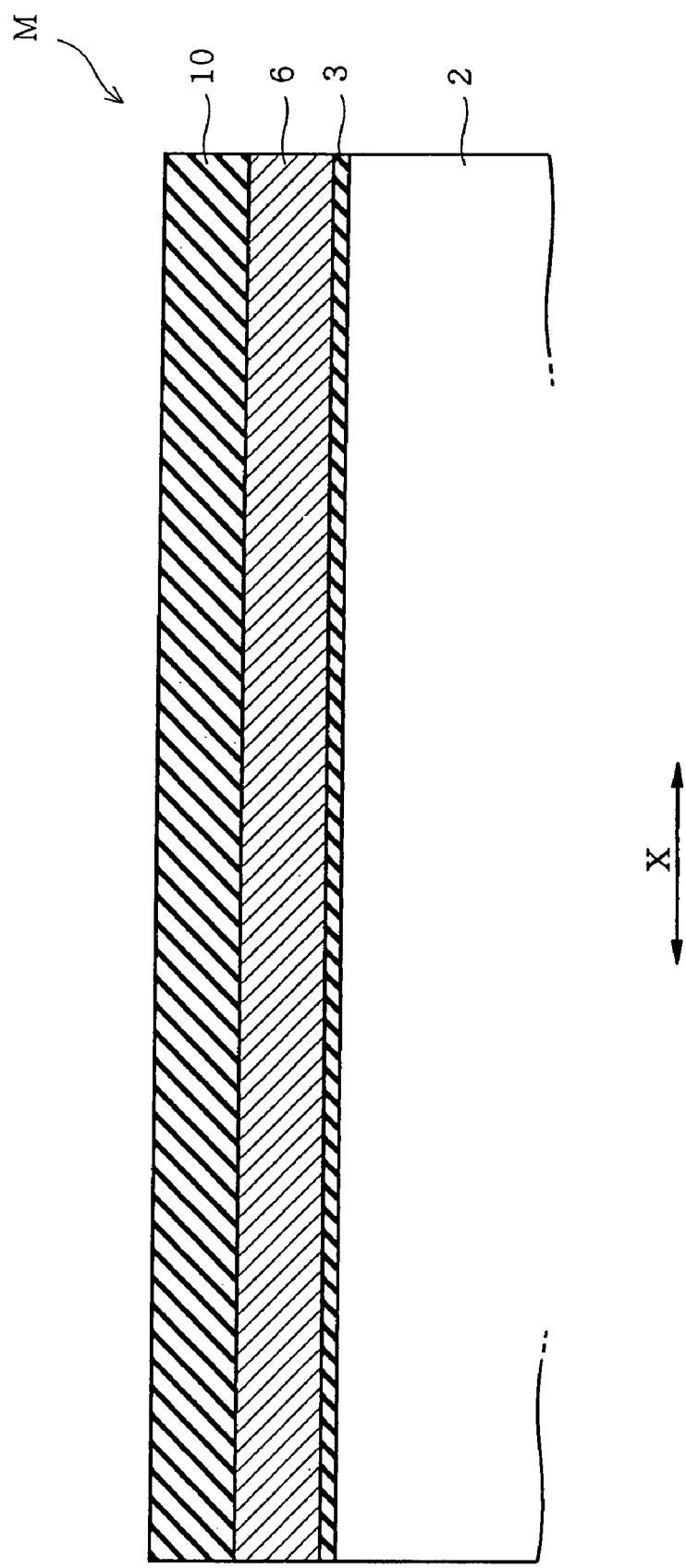
Figure 6:
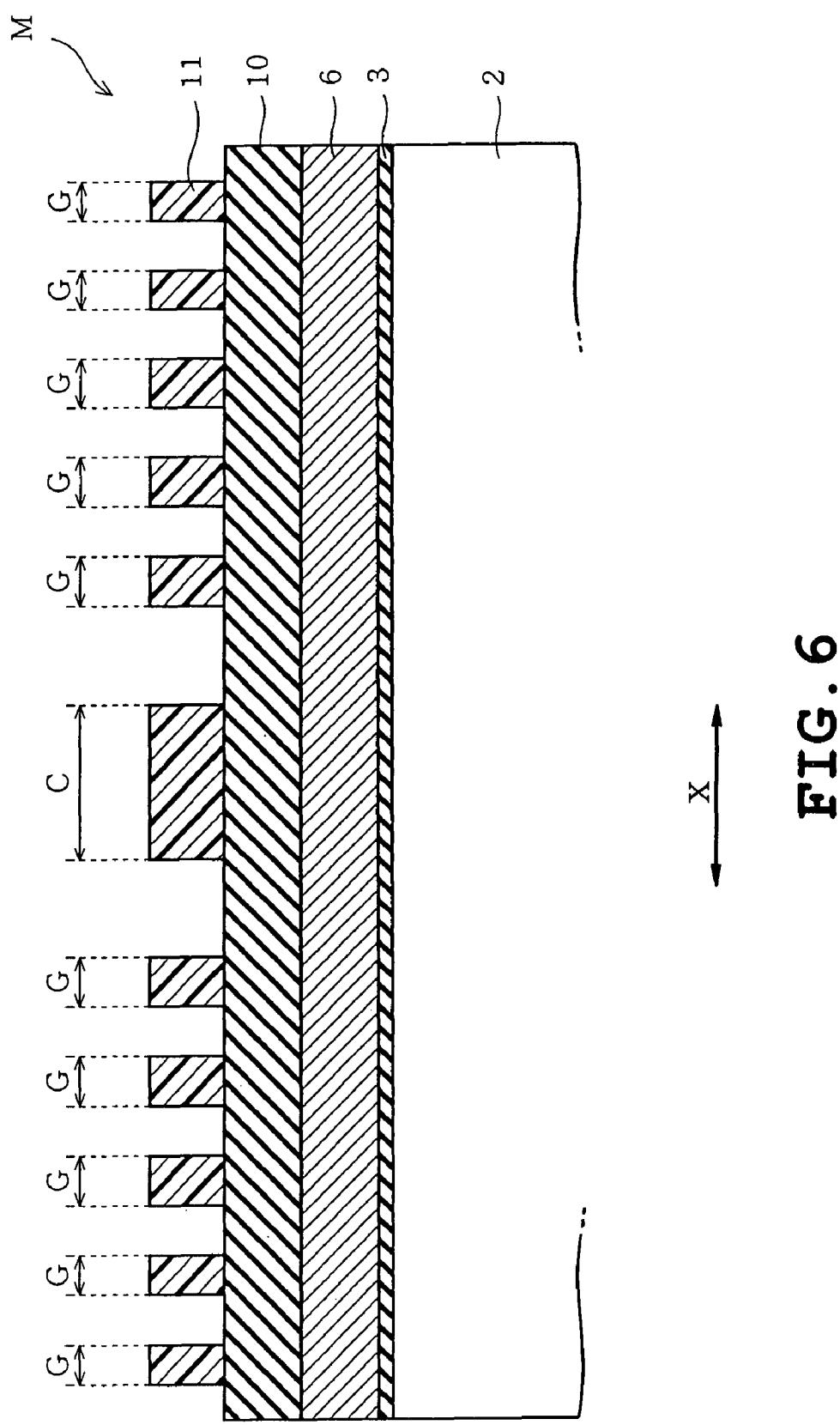

Next, referring to FIG. 5, a silicon nitride film 10 is formed in the thickness of 70 [nm], for example, by LPCVD process directly on the first conductive layer 6. Next, referring to FIG. 6, a resist 11 is coated directly on the silicon nitride film 10 and is patterned to define a region G (gate electrode forming region) where the floating gate electrode layer FG and the dummy gate electrode layer DG are maintained. Similarly, the resist 11 is patterned to also remain in region C for forming the source contact region CS.

Figure 7:
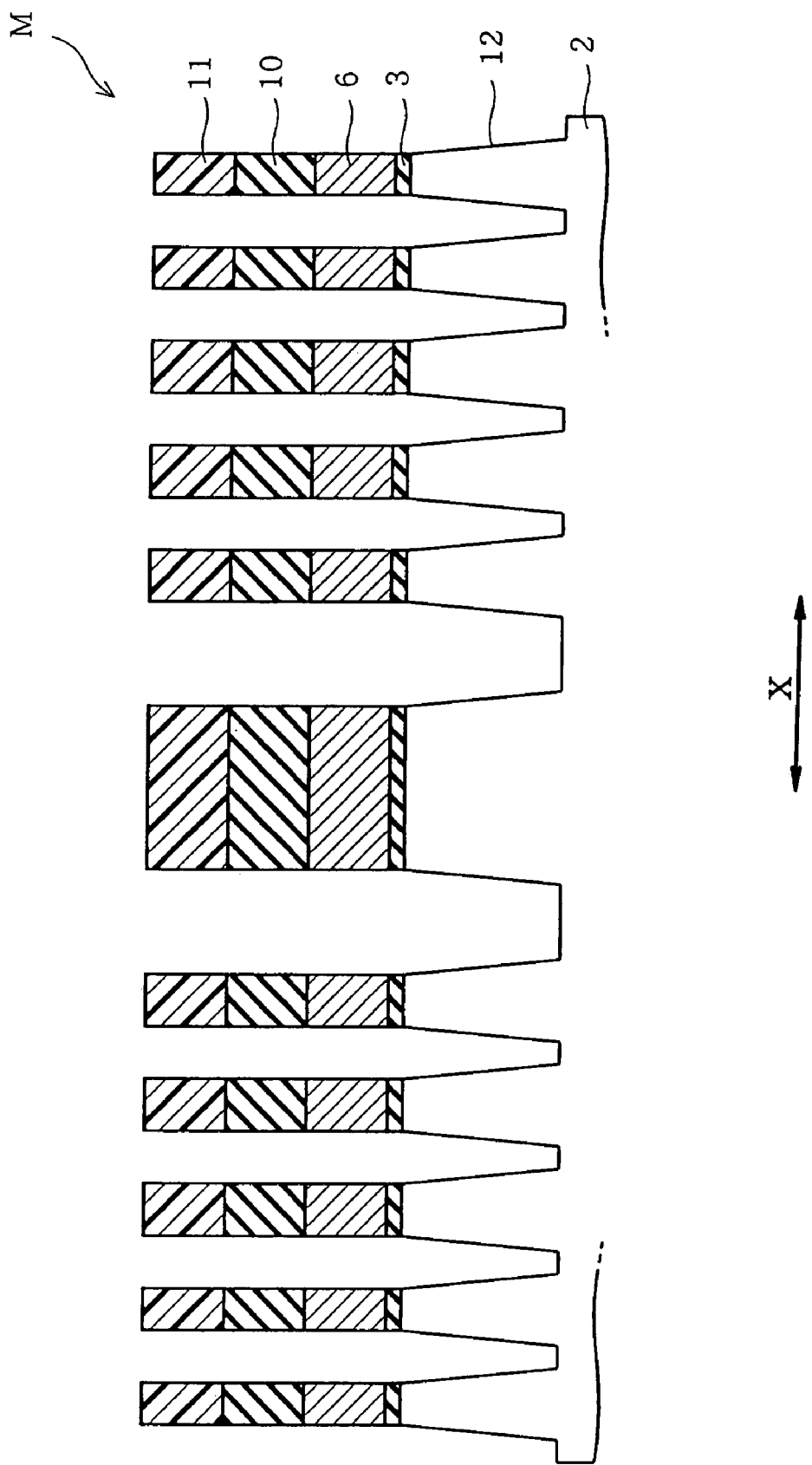

Next, referring to FIG. 7, the silicon nitride film 10 is removed by an isotropic etch (RIE (Reactive Ion Etch) for example) by using the patterned resist 11 as a mask. Subsequently, the first conductive layer 6, the insulating film 3, and the silicon substrate 2 are etched to define a plurality of element isolation trenches 12 along the predetermined direction, more specifically, the Y-direction (direction intersecting the X-direction within the silicon substrate 2 surface) as viewed in FIGS. 1 and 2. Thus, the first conductive layer 6 and the insulating film are respectively separated into plurality of portions.

Figure 8:
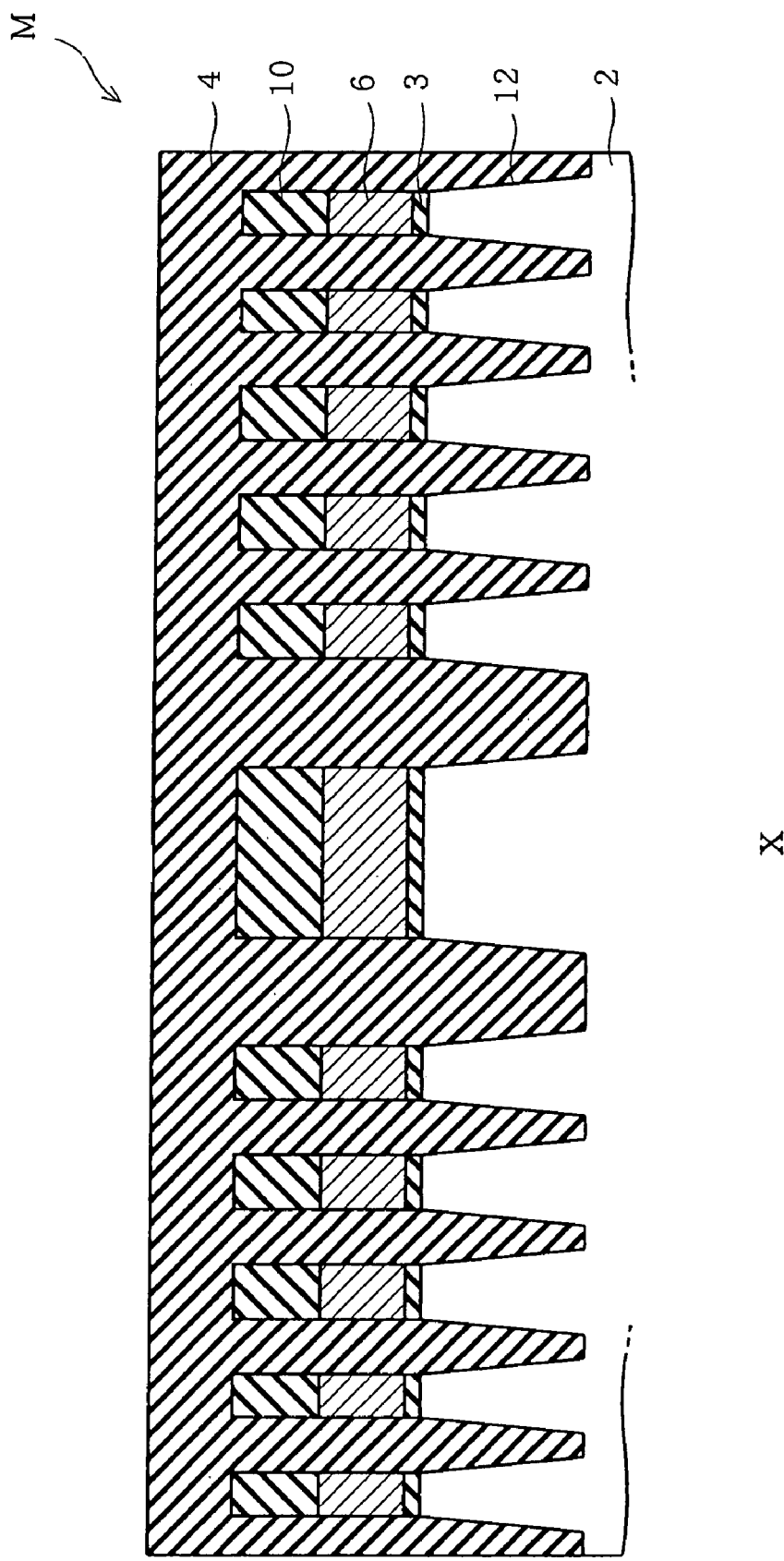

Next, referring to FIG. 8, the resist 11 is removed by ashing technique and the silicon oxide film (TEOS film) composed of TEOS gas is formed inside the element isolation trench 12 by LPCVD process. Thereafter, coat-type insulating film is formed by coating a polysilazane chemical (one variation of silica-based film forming solution) and converting the same into a silicon oxide film. Thus, the TEOS film and the coat-type insulating film are formed as the element isolation insulating film 4.

Figure 9:
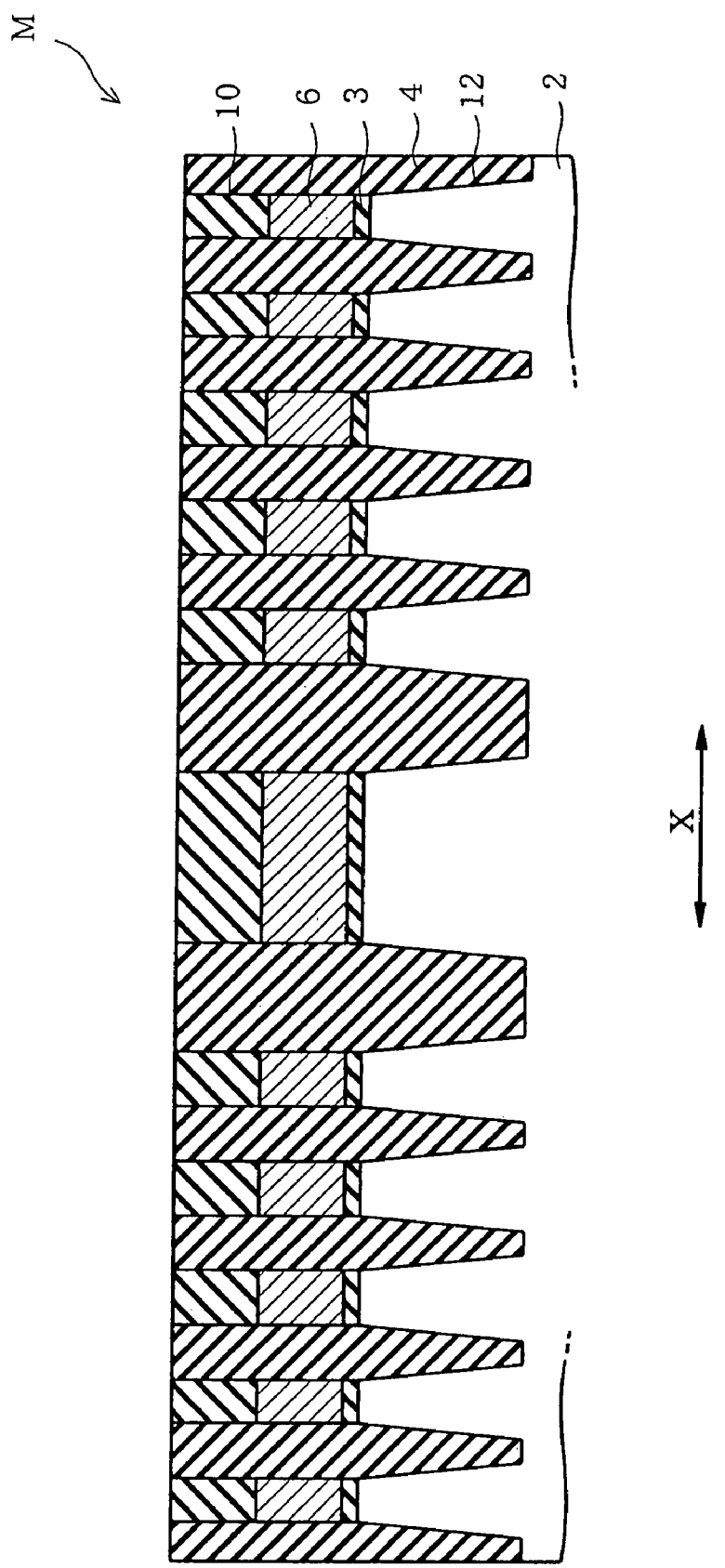

Next, referring to FIG. 9, the element isolation insulating film 4 is planarized by CMP (Chemical Mechanical Polishing) process until the surface of the silicon nitride film 10 is exposed.

Figure 10:
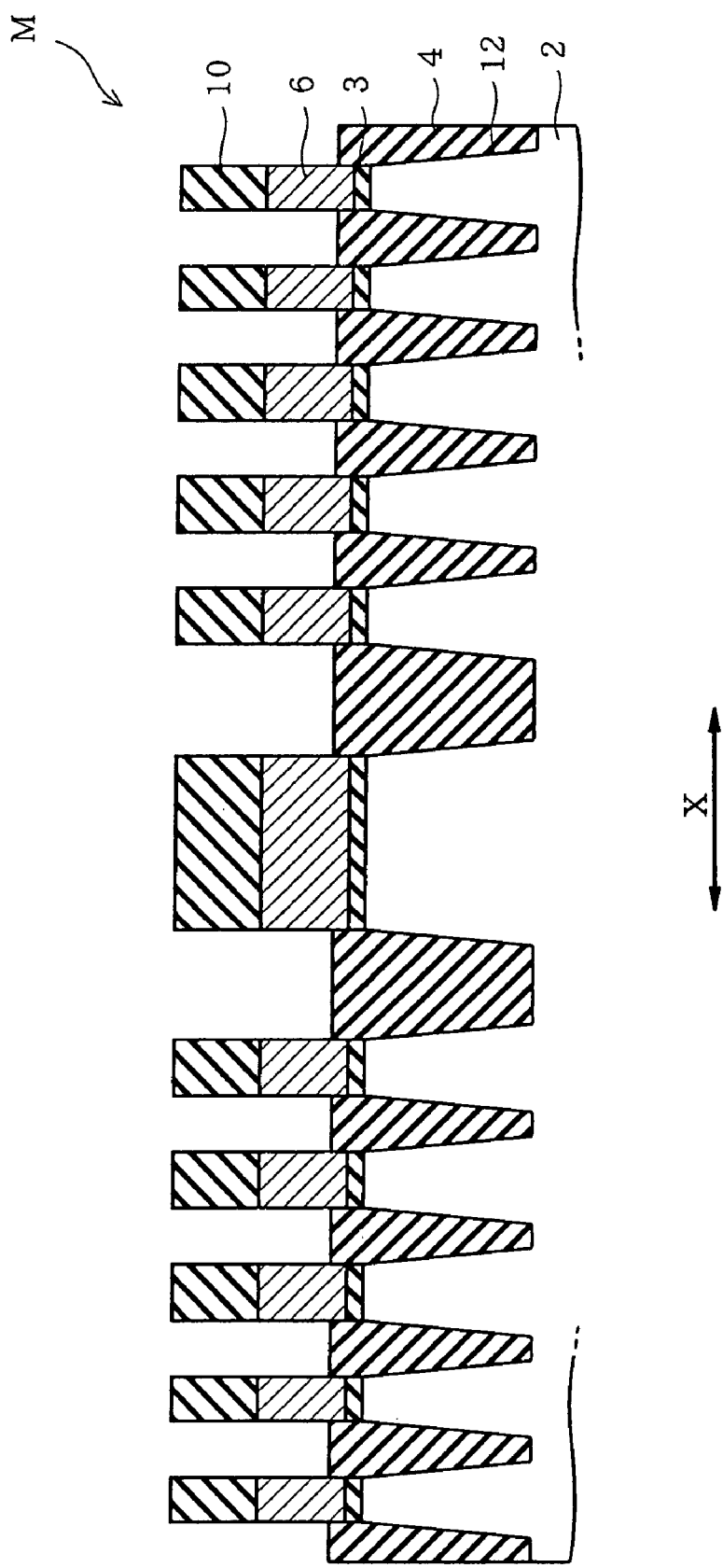

Subsequently, referring to FIG. 10, the surface of the element isolation insulating film 4 is etched in the magnitude of approximately 150 [nm]. Consequently, the upper surface of the element isolation insulating film 4 is configured to be higher than the upper surface of the insulating film 3 and lower than the upper surface of the first conductive layer 6. The silicon nitride film 10 is removed thereafter.

Figure 11:
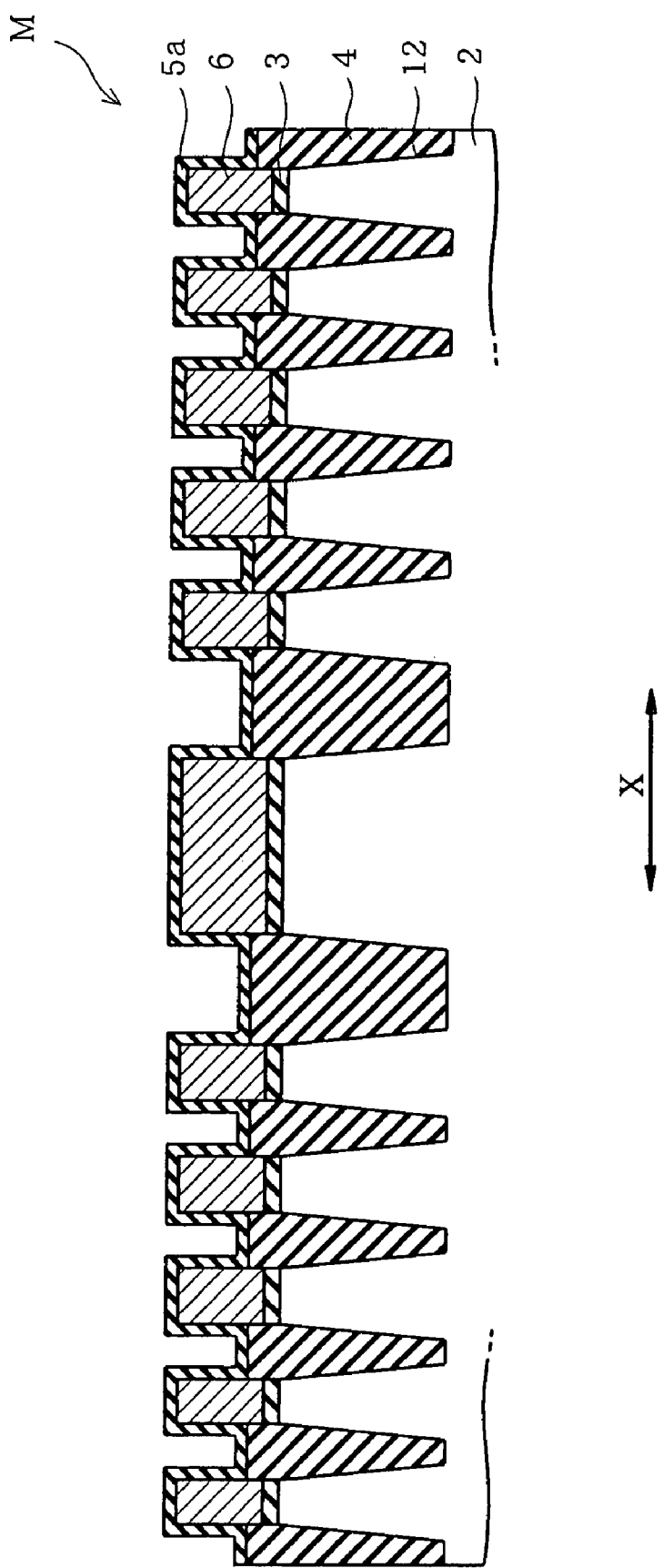

Next, referring to FIG. 11, the lower insulating film 5a is formed in the thickness of 10 [nm], for example by HTO (High Temperature Oxide film). The lower insulating film 5a is formed along in direct contact with the exposed surface (upper surface and upper side-surface) of the first conductive layer 6 so as to cover the first conductive layer 6 and is also formed along in direct contact with the upper surface of the element isolation insulating film 4 so as to cover the exposed upper surface of the element isolation insulating film 4.

Figure 12:
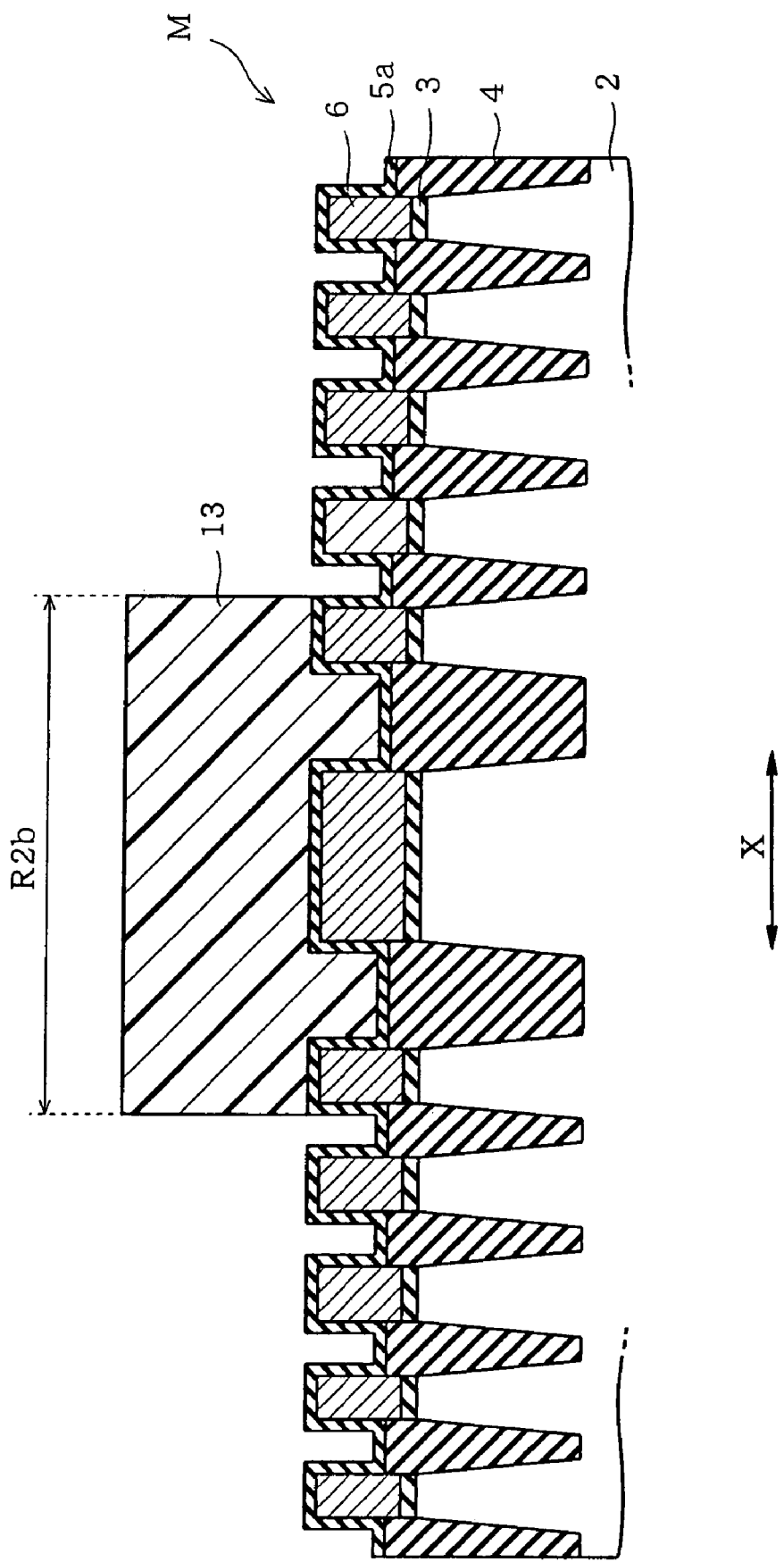

Next, referring to FIG. 12, a resist 13 is coated directly on the lower insulating film 5a and the resist 13 is patterned on the region R2b which has greater width compared to the active area Sa of the memory cell and the gate width. The region R2b indicates a region including the source line contact region CS and one dummy gate region neighboring each of the two sides of the source contact region CS and the element isolation regions disposed at both sides of the source line contact region CS. The region R2b indicates a region designed to have improved breakdown voltage.

Figure 13:
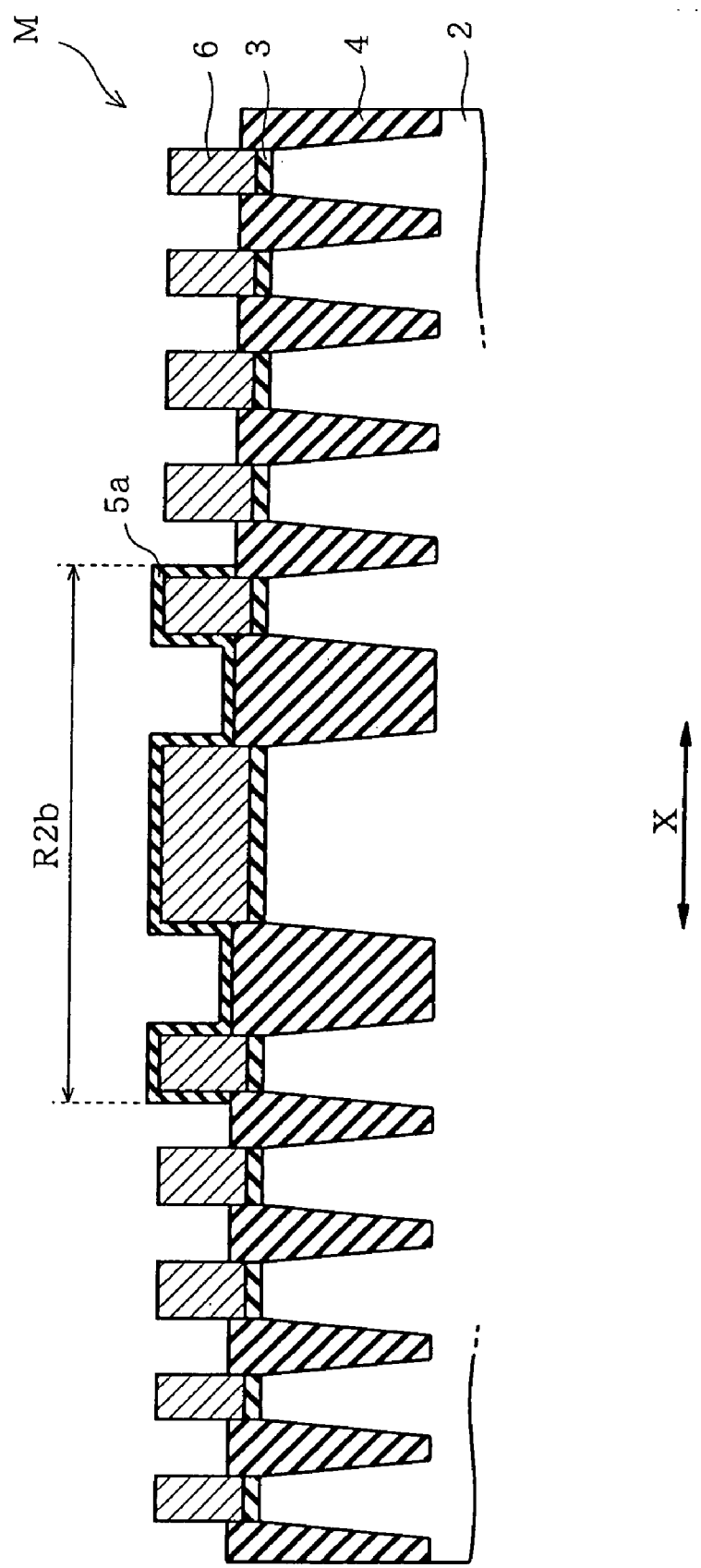

Next, referring to FIG. 13, the insulating film 5a is etched by using the patterned resist 13 as a mask. The insulating film 5a may be etched with high selectivity relative to the element isolation insulating film 4, whereby the etch speed of the insulating film 5a is accelerated as compared with the etch speed of the element isolation insulating film 4, and the insulating film 5a formed in regions other than the region R2b is removed without digging the element isolation insulating film 4. The resist 13 is removed thereafter.

Figure 14:
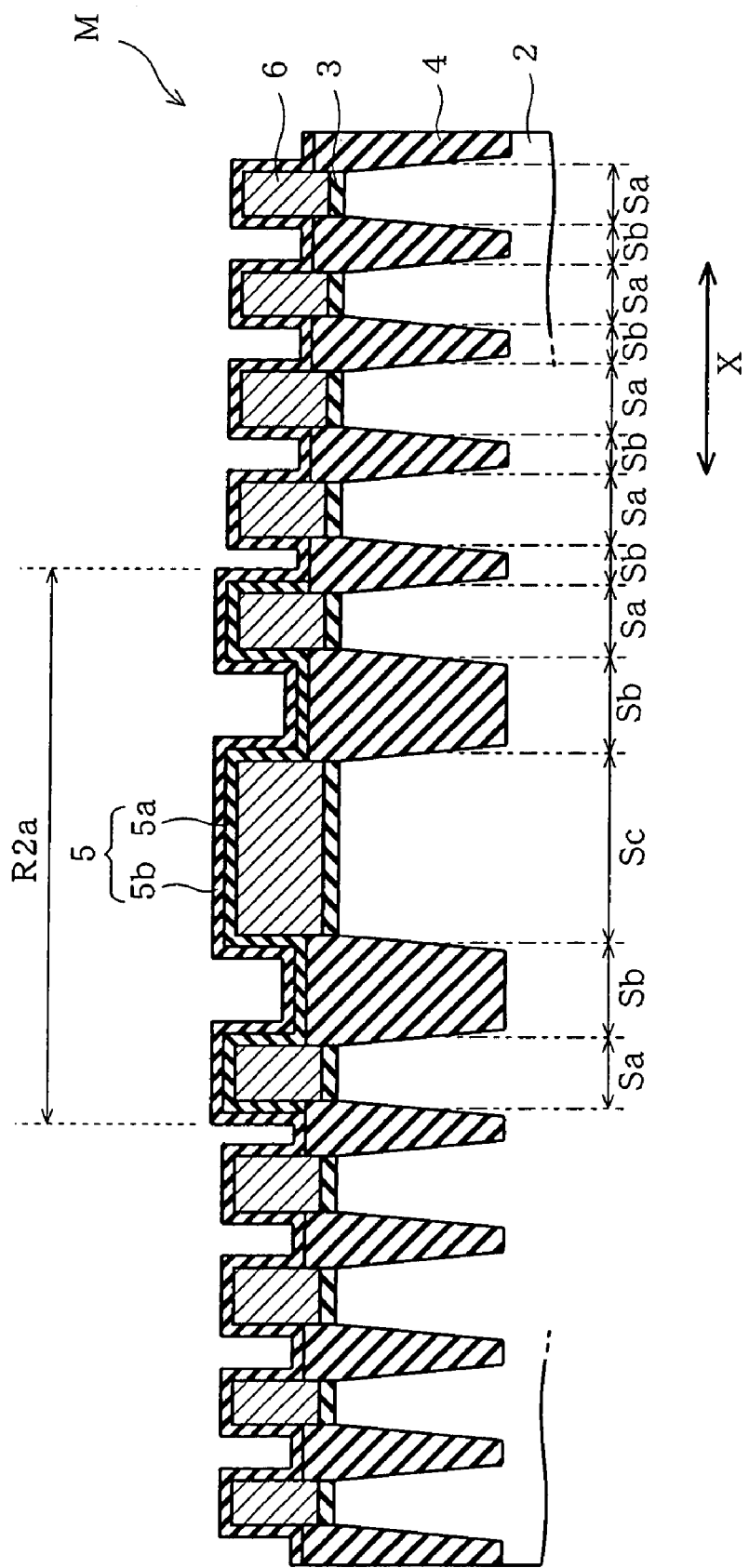

Next, referring to FIG. 14, the fourth insulating film 5b is formed so as to cover the element isolation insulating film 4, the insulating film 5a, and the first conductive layer 6. In case the fourth insulating film 5b employs an ONO film (laminated structure composed of silicon oxide film-silicon nitride film-silicon oxide film), the fourth insulating film 5b is formed by LPCVD. As illustrated in FIG. 14, regions other than the region R2a only has the fourth insulating film 5b formed therein, whereas the region R2a, inclusive of the region R2b, and being formed by laminating the fourth insulating film 5b over the insulating film 5a is allowed to increase the thickness of the inter-conductive layer insulating film 5 as compared to other regions.

Next, referring to FIG. 15, amorphous silicon, doped with impurities such as phosphorous or arsenic, serving as the lower conductive layer 8 is formed directly on the inter-conductive layer insulating film 5 by CVD process. The amorphous silicon constituting the lower conductive layer 8 is converted into polycrystalline silicon by being polycrystallized by thermal processing performed afterwards. The metal silicide is formed as the upper conductive layer 9 by forming metal such as tungsten directly on the lower conductive layer 8 by sputtering process and thereafter performing a thermal process. The lower and upper conductive layers 8 and 9 are formed as the control gate electrode layer CG having a thickness of approximately 300 [nm] for example. Thereafter, the silicon nitride film (not shown) is formed as a gate cap film by LPCVD.

Thereafter, the flash memory 1 can be configured by executing manufacturing steps involving removal of each gate electrode CG and FG in the gate electrode isolation region GV illustrated in FIG. 2, forming an interlayer insulating film (not shown), and forming bit line BL.

Figure 16:
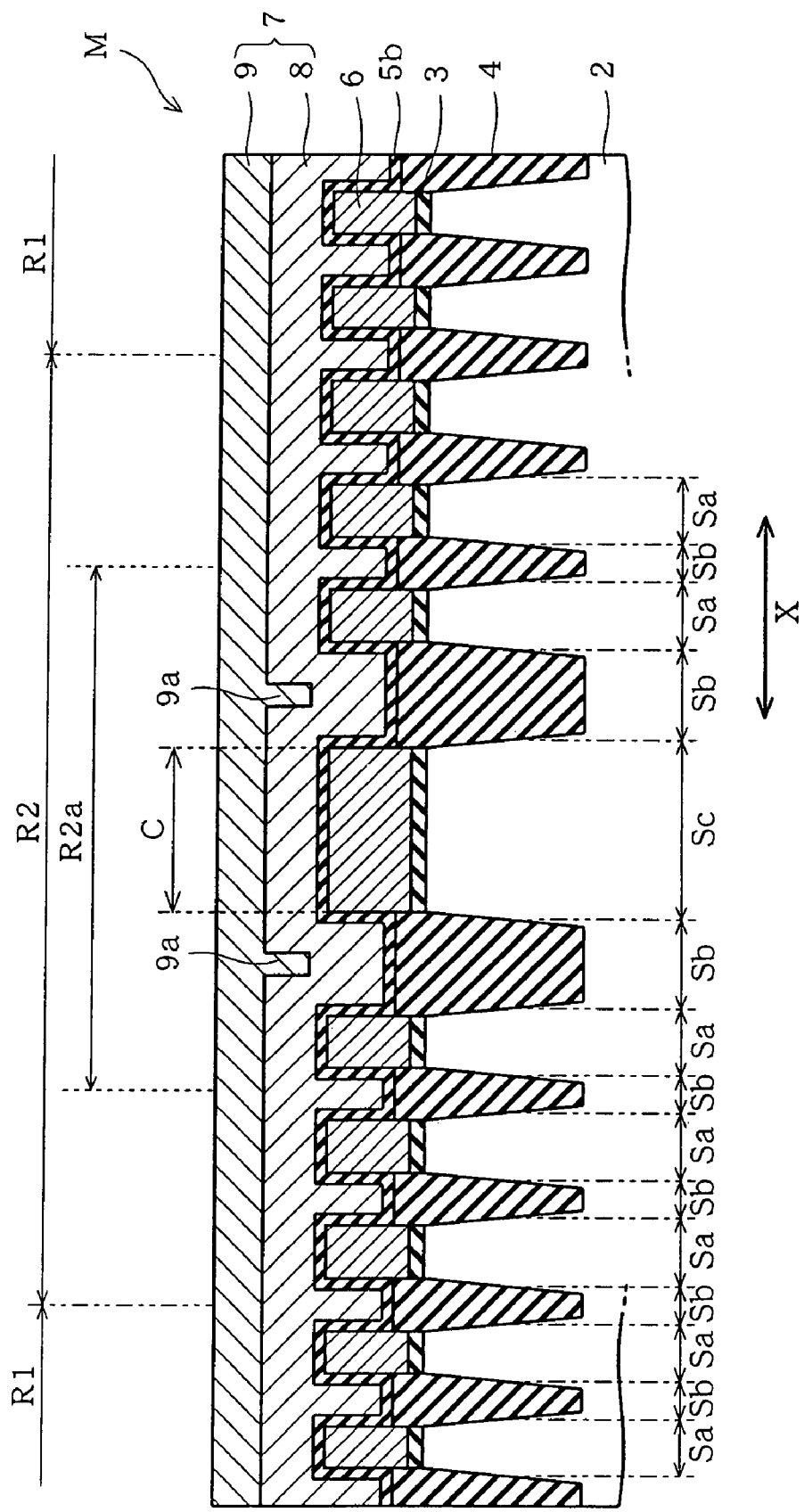
FIG. 16 is a comparative example of FIG. 15.

FIG. 16 illustrates a comparative example. In the above described manufacturing steps, suppose the fourth insulating film 5b is formed directly on the first conductive layer 6 without forming the lower insulating film. In such case, as illustrated in FIG. 16, when the lower conductive layer 8 is subsequently formed and the upper conductive layer 9 is formed directly on the lower conductive layer 8, a recess occurs in the upper portion of the lower conductive layer 8 above the element isolation region Sb in the region R2a in particular; since, the X-directional width of the element isolation region Sb located at both X-directional sides of the element isolation region Sa in the source line contact region CS is configured to have increased width. Consequently, a portion 9a of the lower conductive layer 9 is formed inside the recess of the lower conductive layer 8. As a result, the current mainly flows in the upper conductive layer 9 composed of silicided metal within second conductive layer 7. Such lack of uniformity in the current flowing in the second conductive layer 7 may lead to a device defect. In the present embodiment, since a lower insulating film 5a is formed above the element isolation region Sb having increased width, and the fourth insulating film 5b is formed further on the lower insulating film 5a, greater degree of uniformity can be achieved in the current distribution of the current flowing in the second conductive layer 7.

According to the manufacturing method of the present embodiment, since the inter-conductive layer insulating film 5 in the region R2a of the second region R2 is formed in greater thickness compared to other regions, improved breakdown voltage can be achieved.

Since the inter-conductive layer insulating film 5 is formed in increased thickness in the region above the element isolation region Sb in the region R2a, greater degree of uniformity can be achieved in the current distribution of current flowing in the second conductive layer 7.

Since the insulating film 5a is etched with higher selectivity relative to the element isolation insulating film 4, the insulating film 5a can be removed without digging down the element isolation insulating film 4.

Figure 17:
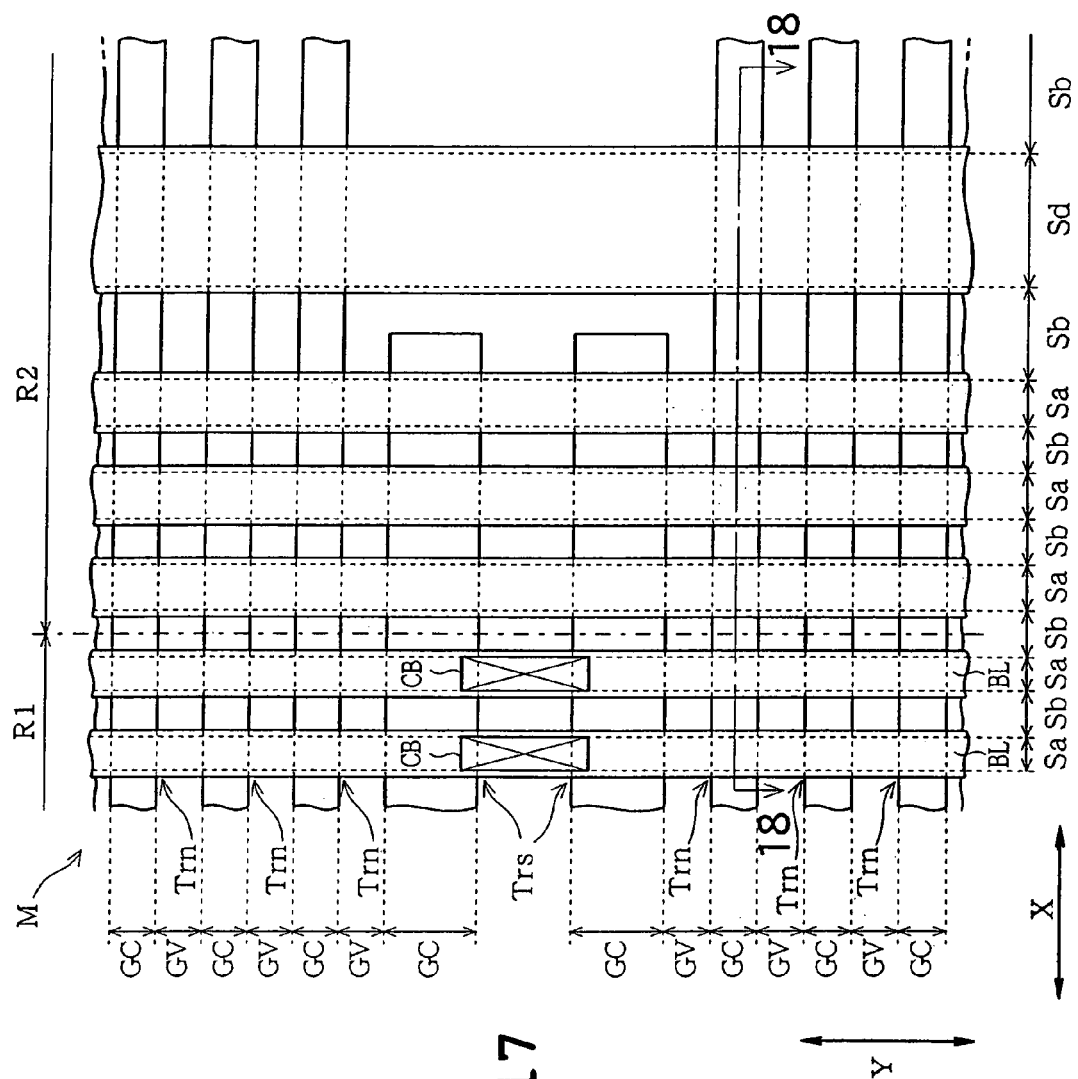
FIG. 17 corresponds to FIG. 2 and indicates a second embodiment of the present disclosure.
Figure 18:
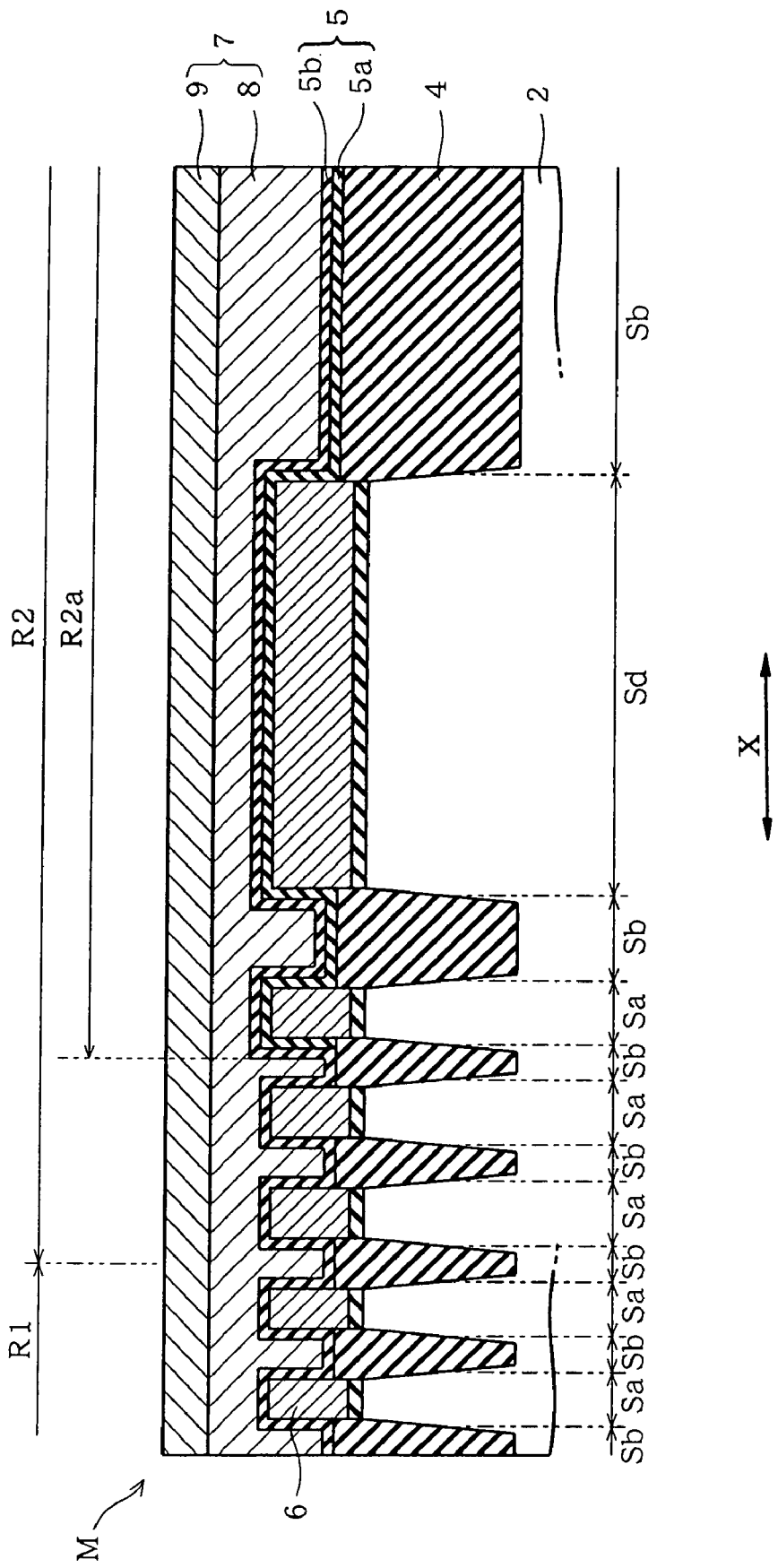
FIG. 18 corresponds to FIG. 15.

FIGS. 17 to 18 illustrate a second embodiment of the present disclosure and the difference between the embodiment described earlier lies in the incorporation of the guard ring region (cell array end region). The portions that are identical to the embodiment described earlier will be identified with the same reference symbols. Description will only be given on the portions that differ.

FIG. 17 is a schematic plan view replacing FIG. 2. FIG. 18 replaces FIG. 15 of the embodiment described earlier and indicates a schematic vertical cross sectional view taken along line 18-18 of FIG. 17.

As illustrated in FIG. 17, a guard ring region (cell array end region) serving as the second region R2 is provided at the end of the memory cell region M. The element isolation region Sb having greater width compared to the element isolation region Sb of the region R1 is provided in the guard ring region to provide improved insulation from other electrical components. Referring to FIG. 18, an element isolation region Sd having increased width is provided beside the element isolation region Sb in the region R2a of the second region R2. The structure formed on the active area Sd in the silicon substrate 2 takes the same structure as the structure formed on the active area Sa in the silicon substrate 2. The width between the sidewalls of the first conductive layer 6 of the active area Sd is formed in greater width compared to the width between the sidewalls of the first conductive layer 6 of the active area Sa.

The lower insulating film 5a is formed so as to cover the upper surface and the upper side-surface of the first conductive layer 6 and the upper surface of the element isolation insulating film 4 that are formed in the region R2a. The lower insulating film 5a is formed along in direct contact with the upper surface and the upper side-surface of the first conductive layer 6 and formed along in direct contact with the upper surface of the element isolation insulating film 4. The upper insulating film 5b is formed across the regions R1 and R2 so as to cover the upper surface and the upper side-surface of the first conductive layer 6 and the upper surface of the element isolation insulating film 4. In the region R2a, the upper insulating film 5b is formed along in direct contact with the upper surface of the lower insulating film 5a. In regions other than the region R2a (region R1 and the rest of the second region R2), the upper insulating film 5b is formed along in direct contact with the upper surface and the upper side-surface of the first conductive layer 6 and along in direct contact with the upper surface of the element isolation insulating film 4. In the region R2a, the inter-conductive layer insulating film 5 is configured by a laminated structure composed of the lower insulating film 5a and the upper insulating film 5b, whereby the breakdown voltage of the region R2a is improved as in the embodiment described earlier.

According to the present embodiment, since the inter-conductive layer insulating film 5 in the region R2a of the second region R2 serving as the guard ring region (cell array end region) is formed with greater thickness compared to other regions, operation and effect substantially the same as the earlier described embodiment can be achieved.

The present disclosure is not limited to the above described embodiments but can be modified or expanded as follows.

The present disclosure may be employed by a nonvolatile semiconductor storage device and other semiconductor devices besides the flash memory 1. Materials other than the silicon substrate 2 may be employed as the semiconductor substrate.

Insulating films such as TEOS-$O_3$ may be employed as the element isolation insulating film 4.

The second region R2 has been employed in the guard ring region (cell array end region) and the source line contact region (well contact region) of the memory cell region M. However it is not limited to such use but may be employed in a shunt resistance forming region. For instance, referring to the plan view illustrated in FIG. 2, a shunt resistance may be configured by connecting the conductive layer of the select gate line SL that connects the select gate electrodes of the select gate transistors Trs. Under such configuration also, dummy gate electrode layer DG may be configured below the region where the shunt resistance is formed. Thus, the inter-conductive layer insulating film 5 may be formed in increased thickness as in the earlier described embodiment in such region also, which also provides improved breakdown voltage, thereby achieving substantially the same operation and effects as the earlier described embodiments.

The foregoing description and drawings are merely illustrative of the principles of the present disclosure and are not to be construed in a limited sense. Various changes and modifications will become apparent to those of ordinary skill in the art. All such changes and modifications are seen to fall within the scope of the disclosure as defined by the appended claims.

What is claimed is:

1. A semiconductor device, comprising:
a semiconductor substrate including a first region and a second region adjacent to the first region;
a floating gate electrode formed above the semiconductor substrate in the first region, the floating gate electrode including a first upper surface and a first width;
a dummy gate electrode formed above the semiconductor substrate in the second region, the dummy gate electrode including a second upper surface and a second width being greater than the first width of the floating gate electrode;
a control gate electrode formed above the floating and dummy gate electrodes, the control electrode including a first lower surface facing the first upper surface of the floating gate electrode and a second lower surface facing the second upper surface of the dummy gate electrode;
a first gate insulating film located between the floating gate electrode and the control gate electrode, the first gate insulating film including a first thickness; and
a second gate insulating film located between the dummy gate electrode and the control gate electrode, the second gate insulating film including a second thickness being greater than the first thickness of the first gate insulating film,
wherein a first distance between the first upper surface of the floating gate electrode and the first lower surface of the control gate electrode is smaller than a second distance between the second upper surface of the dummy gate electrode and the second lower surface of the control gate electrode.

2. The device of claim 1, wherein the second gate insulating film is configured by laminating other insulating films in addition to the first gate insulating film.

3. The device of claim 1, wherein the second region includes a contact formed therein to electrically connect to a source line.

4. The device of claim 1, further including another first region, the second region being disposed between the first regions.

5. The device of claim 1, wherein the first thickness of the first gate insulating film is equivalent to the first distance between the first upper surface of the floating gate electrode and the first lower surface of the control electrode; and
the second thickness of the second gate insulating film is equivalent to the second distance between the second upper surface of the dummy gate electrode and the second lower surface of the control electrode.

6. The device of claim 1, wherein the floating gate electrode, the dummy gate electrode and the control gate electrode each include a polycrystalline silicon film.

7. The device of claim 2, wherein the first gate insulating film includes one of an ONO (Oxide-Nitride-Oxide) film, a NONON (Nitride-Oxide-Nitride-Oxide-Nitride) film or an alumina film.

8. The device of claim 7, wherein the second gate insulating film includes an HTO (High Temperature Oxide) film and one of an ONO (Oxide-Nitride-Oxide) film, a NONON (Nitride-Oxide-Nitride-Oxide-Nitride) film or an alumina film.

9. A semiconductor device, comprising:
a semiconductor substrate including an upper surface having a first region and a second region adjacent to the first region, the first region including a plurality of first active areas formed along a first direction, the second region including a plurality of second active areas formed along the first direction, each of the first active areas including a first width taken along a second direction crossing the first direction, each of the second active areas including a second width taken along the second direction being greater than the first width of each of the first active areas;
a plurality of floating gate electrodes formed above the first active areas so as to be isolated from each other in the second direction, each of the floating gate electrodes including a first upper surface and a third width;
a plurality of dummy gate electrodes formed above the second active areas so as to be isolated from each other in the second direction, at least one of the dummy gate electrodes including a second upper surface and a fourth width being greater than the third width of each of the floating gate electrodes;
a control gate electrode formed above the plurality of floating and dummy gate electrodes along the second direction, the control electrode including a first lower surface facing the first upper surface of each of the floating gate electrodes and a second lower surface facing the second upper surface of the at least one of the dummy gate electrodes;
a first gate insulating film located between each of the floating gate electrodes and the control gate electrode, and including a first thickness; and
a second gate insulating film located between the at least one of the dummy gate electrodes and the control gate electrode, and including a second thickness being greater than the first thickness of the first gate insulating film,
wherein a first distance between the first upper surface of each of the floating gate electrodes and the first lower surface of the control gate electrode is smaller than a second distance between the second upper surface of the at least one of the dummy gate electrodes and the second lower surface of the control gate electrode.

10. The device of claim 9, wherein the second gate insulating film is configured by laminating other insulating films in addition to the first gate insulating film.

11. The device of claim 9, wherein the second region includes a contact formed therein to electrically connect to a source line.

12. The device of claim 9, further including another first region, the second region being disposed between the first regions.

13. The device of claim 9, wherein the first thickness of the first gate insulating film is equivalent to the first distance between the first upper surface of each of the floating gate electrodes and the first lower surface of the control gate electrode; and the second thickness of the second gate insulating film is equivalent to the second distance between the second upper surface of the at least one of the dummy gate electrodes and the second lower surface of the control gate electrode.

14. The device of claim 9, wherein the floating gate electrodes, the dummy gate electrodes and the control gate electrode each include a polycrystalline silicon film.

15. The device of claim 10, wherein the first gate insulating film includes one of an ONO (Oxide-Nitride-Oxide) film, a NONON (Nitride-Oxide-Nitride-Oxide-Nitride) film or an alumina film.

16. The device of claim 15, wherein the second gate insulating film includes an HTO (High Temperature Oxide) film and one of an ONO (Oxide-Nitride-Oxide) film, a NONON (Nitride-Oxide-Nitride-Oxide-Nitride) film or an alumina film.

* * * * *